(12) United States Patent
Yazami

(10) Patent No.: US 12,255,293 B2
(45) Date of Patent: Mar. 18, 2025

(54) METHOD AND SYSTEM FOR DETECTING INTERNAL SHORT-CIRCUIT (ISC) IN BATTERIES AND BATTERY CELLS IMPLEMENTING SUCH ISC DETECTION METHOD

(71) Applicant: Yazami IP PTE. LTD., Singapore (SG)

(72) Inventor: Rachid Yazami, Singapore (SG)

(73) Assignee: Yazami IP PTE. LTD., Singapore (SG)

( * ) Notice: Subject to any disclaimer, the term of this patent is extended or adjusted under 35 U.S.C. 154(b) by 917 days.

(21) Appl. No.: 17/059,764

(22) PCT Filed: May 28, 2019

(86) PCT No.: PCT/IB2019/054411
§ 371 (c)(1),
(2) Date: Nov. 30, 2020

(87) PCT Pub. No.: WO2019/229651
PCT Pub. Date: Dec. 5, 2019

(65) Prior Publication Data
US 2021/0208208 A1 Jul. 8, 2021

(30) Foreign Application Priority Data
May 28, 2018 (SG) .............................. 10201804493S

(51) Int. Cl.
*H01M 10/42* (2006.01)
*G01R 31/367* (2019.01)
(Continued)

(52) U.S. Cl.
CPC ...... *H01M 10/4257* (2013.01); *G01R 31/367* (2019.01); *G01R 31/3835* (2019.01);
(Continued)

(58) Field of Classification Search
CPC .......... H01M 10/4257; H01M 10/425; H01M 10/46; H01M 10/48; H01M 10/44;
(Continued)

(56) References Cited

U.S. PATENT DOCUMENTS 9,774,197 B1 * 9/2017 Li .................. H02J 7/0019
2001/0003169 A1 6/2001 Kaneko et al.
(Continued)

FOREIGN PATENT DOCUMENTS

CH 711926 A1 6/2017
CN 101034141 A 9/2007
(Continued)

OTHER PUBLICATIONS

Maher et al., "A study of lithium ion batteries cycle aging by thermodynamics techniques," 2014, Journal of Power Sources, 247, 527-533. (Year: 2014).*
(Continued)

*Primary Examiner* — Matthew W Van Oudenaren
(74) *Attorney, Agent, or Firm* — TraskBritt

(57) ABSTRACT

A method for detecting internal short circuit within an electrochemical cell, from on-line measuring and processing thermodynamics data and kinetics data on the electrochemical cell. The thermodynamics data comprises open-circuit voltage data, entropy variations and/or enthalpy variations data, and combinations thereof. The kinetics data comprises cell voltage, cell temperature, cell internal resistance and current, and combinations thereof.

7 Claims, 25 Drawing Sheets

(51) Int. Cl.
| | |
|---|---|
| *G01R 31/3835* | (2019.01) |
| *G01R 31/389* | (2019.01) |
| *G01R 31/392* | (2019.01) |
| *G01R 31/396* | (2019.01) |
| *G01R 31/52* | (2020.01) |
| *H01M 10/46* | (2006.01) |
| *H01M 10/48* | (2006.01) |
| *H02J 7/00* | (2006.01) |

(52) U.S. Cl.
CPC ......... *G01R 31/389* (2019.01); *G01R 31/392* (2019.01); *G01R 31/396* (2019.01); *G01R 31/52* (2020.01); *H01M 10/425* (2013.01); *H01M 10/46* (2013.01); *H02J 7/0047* (2013.01); *H02J 7/0048* (2020.01); *H02J 7/005* (2020.01); *H01M 2010/4271* (2013.01); *H01M 2010/4278* (2013.01); *H01M 10/48* (2013.01)

(58) Field of Classification Search
CPC ..... H01M 10/4285; H01M 2010/4271; H01M 2010/4278; G01R 31/367; G01R 31/3835; G01R 31/389; G01R 31/392; G01R 31/396; G01R 31/52; H02J 7/0047; H02J 7/0048; H02J 7/005
See application file for complete search history.

(56) References Cited

U.S. PATENT DOCUMENTS

| | | | |
|---|---|---|---|
| 2006/0244458 A1* | 11/2006 | Cho | B60L 58/12 |
| | | | 324/426 |
| 2007/0182418 A1* | 8/2007 | Reynier | H01M 6/50 |
| | | | 324/429 |
| 2010/0201321 A1* | 8/2010 | Asakura | B60L 3/0038 |
| | | | 320/132 |
| 2011/0068800 A1* | 3/2011 | Nishino | H01M 10/425 |
| | | | 324/426 |
| 2016/0190833 A1 | 6/2016 | Roumi et al. | |
| 2018/0196107 A1* | 7/2018 | Fleischer | G01R 31/367 |

FOREIGN PATENT DOCUMENTS

| | | |
|---|---|---|
| CN | 101765940 A | 6/2010 |
| CN | 106371022 A | 2/2017 |
| CN | 106932722 A | 7/2017 |
| CN | 107192914 A | 9/2017 |
| KR | 10-2017-0059208 | 5/2017 |
| WO | 2013/043123 A1 | 3/2013 |
| WO | 2017/102272 A1 | 6/2017 |

OTHER PUBLICATIONS

Baghdadi et al., State of Health Assessment for Lithium Batteries Based on Voltage-Time Relaxation Measure, Electrochemica Acta, vol. 194, (2016), pp. 461-472.
European Communication Pursuant to Article 94(3) EPC for Application No. 197400609 dated Oct. 20, 2023, 5 pages.
International Search Report for International Application No. PCT/IB2019/054411 dated Sep. 3, 2019, 3 pages.
International Written Opinion for International Application No. PCT/IB2019/054411 dated Sep. 3, 2019, 8 pages.
Chinese First Office Action for Application No. 201980048356.3 dated Jan. 15, 2024, 8 pages.

* cited by examiner

| SoC | 80% | | 70% | | 60% | |
|---|---|---|---|---|---|---|
| Parameters | ISC | No ISC | ISC | No ISC | ISC | No ISC |
| $U_0$ | 3.92205 | 3.91631 | 3.83212 | 3.82494 | 3.74319 | 3.74106 |
| $A_1$ | -0.02356 | -0.02203 | -0.0262 | -0.03008 | -0.0198 | -0.03151 |
| $t_1$ | 2.65198 | 3.51849 | 2.84696 | 3.85347 | 10.25834 | 13.55465 |

Fitting Equation:
$$U(t) = U_0 + A_1 e^{-\frac{t}{t_1}}$$
$U(t)$ = time 't' dependent OCV
$U_0$ = Equilibrium OCV (t=∞)
$A_1$ = pre-exponential coefficient
$t_1$ = time constant

*FIG. 14*

METHOD AND SYSTEM FOR DETECTING INTERNAL SHORT-CIRCUIT (ISC) IN BATTERIES AND BATTERY CELLS IMPLEMENTING SUCH ISC DETECTION METHOD

CROSS-REFERENCE TO RELATED APPLICATIONS

This application is a national phase entry under 35 U.S.C. § 371 of International Patent Application PCT/IB2019/054411, filed May 28, 2019, designating the United States of America and published as International Patent Publication WO 2019/229651 A1 on Dec. 5, 2019, which claims the benefit under Article 8 of the Patent Cooperation Treaty to Singapore Patent Application Serial No. 10201804493S, filed May 28, 2018.

TECHNICAL FIELD

The present disclosure relates to a method for detecting internal short-circuit (ISC) in batteries. It also relates to a system and battery cells implementing the detection method.

BACKGROUND

A battery cell consists of an anode (negative pole), a cathode (positive pole), an electrolyte and a separator, among other constituents. During normal operation such as discharge only for a primary battery (disposable) and charge and discharge for a secondary (rechargeable) battery ions and electrons are flowing simultaneously. Ions are flowing inside the cell between anode and cathode owing to the electrolyte, whereas electrons are flowing outside the cell into a load (such as a cellphone) during discharge and into a charger during charge.

There should be no electrons flowing inside the cell between anode and cathode. For this reason, a separator is used between anode and cathode to avoid any physical contact between them. Should electrons flow inside the cell, this leads to self-discharge and capacity loss of the cell, which is undesirable.

An internal short-circuit (ISC) occurs in a battery cell when anode and cathode get in direct electrical contact with each other inside the cell.

Because of the existing difference in voltage between anode and cathode, $\Delta V$ (in Volts (V)) an electrical contact between anode and cathode will generate an electric current I (in Amperes (A)), generally called an ISC current or internal leak current.

An ISC has an ohmic resistance between anode and cathode, R (in Ohms (a)).

The current flowing between anode and cathode is given by the Ohm's law:

$$\Delta V = RI \quad (1).$$

In Eq. (1), $\Delta V$ and R vary with time and so does the ISC current I.

When a current I flows into a resistance R a heat power is generated given by the Joule's law $$P(W) = R \cdot I^2 \quad (2).$$

Because of the internal heat generated due to the ISC, the local temperature may rise, eventually triggering a thermal event in the cell such as a thermal runaway.

Accordingly, an ISC raises a safety issue in a battery cell. ISC is considered one of the major root causes of battery thermal events such as thermal runaway, gassing, fire and explosion.

The main reasons an ISC occurs in a battery cell are:
1) Metal dendrite growth on anode surfaces, which eventually crosses the separator causing a short-circuit. Growth of dendrites has been reported for Li and Zn chemistry-based anodes,
2) Metal and other electrically conducting materials particles in the cell due to manufacturing defects, electrode disintegration and dissolution/precipitation processes,
3) Rupture in the separator between anode and cathode due to fatigue and/or mechanical pressure within the cell, and
4) Defective cell design.

Should one cell in a battery pack undergo a thermal runaway, the heat generated propagates to the neighbor cells, which in turn may undergo a thermal runaway leading to a catastrophic chain of thermal events. During thermal runaway of a lithium-ion battery, for instance, cells temperature may rise above 1000° C., causing metal melting and emission of hot metal particles.

Because of serious safety risks caused by an ISC, it is important to develop methods and systems able to detect the early stages of an ISC formation before a thermal event may take place in a battery cell.

BRIEF SUMMARY

The present disclosure provides a method and a system to detect ISC in a battery cell and is about using thermodynamics and kinetics data to detect an ISC in a battery cell.

The method applies to any type of batteries, including but not limited to lithium-ion battery cells (LIB), nickel cadmium cells (NiCd), nickel metal hydride cells (NIMH), lead acid batteries (LAB), Zinc-air cells, Zinc manganese dioxide cells, redox flow batteries, lithium manganese oxide cells, lithium sulfur and lithium air cells.

Useful thermodynamics data in the present disclosure include but not limited to open-circuit voltage (OCV), entropy ($\Delta S$) and enthalpy ($\Delta H$) data and combinations thereof.

Useful kinetics data include, but not limited to: cell voltage, cell temperature, cell internal resistance and current and combinations thereof.

Thermodynamics data and kinetics data can be measured and processed online owing to an integrated circuit including a smart chip to manage a single cell and a plurality of cells (cell modules, cell packs).

$\Delta S$ and $\Delta H$ are determined from the OCV and from the temperature dependence of OCV using equations (3), (4):

$$\Delta S(x) = F\left(\frac{\partial E_0(x, T)}{\partial T}\right)_{x,p} \quad (3)$$

$$\Delta H(x) = -F\left(E_0(x, T) + T\left(\frac{\partial E_0(x, T)}{\partial T}\right)_{x,p}\right) \quad (4)$$

where $E_0$ is the OCV, x=state of charge, T=temperature, p=pressure and F=the Faraday constant.

OCV, $\Delta S$ and $\Delta H$ data are plotted vs. the cell charge and discharge capacity (Ah) and/or vs. the cell state of charge (SOC) and/or the cell state of discharge (SOD, SOD=100−SOC).

$\Delta S$ and $\Delta H$ data are also usually plotted vs. the cell OCV.

OCV, ΔS and ΔH profiles vary with the battery ageing, which relates to the cell state of health (SOH).

The cell voltage varies with the SOC. It increases during charging and decreases during discharging.

When a cell is at rest after charge or discharge—no external current is flowing in the cell—the cell OCV vs. time profile varies with SOC, SOH and temperature 'T':

$$OCV(t)=f(SOC,SOH,T) \tag{5}$$

a process called cell voltage relaxation.

At fixed SOC and T the OCV vs. time tends to stabilize toward equilibrium OCV.

OCV varies with T enabling ΔS and ΔH to be measured at well-defined SOC and measured OCV as in shown in Eq. (3) and (4).

Significant differences have been found in thermodynamics and kinetics data between cells having and not having an ISC. Differences are found in the following:
OCV, ΔS and ΔH vs. SOC profiles;
ΔS and ΔH vs. OCV profiles;
OCV relaxation profiles at different SOC and temperature; and
Cell voltage profile vs. capacity during charge and discharge.

Thermodynamics and kinetics data comparative analysis enables early stage detection of an ISC.

At fixed cell OCV, the ΔS and ΔH data are significantly different when cell has a ISC as compared when a cell doesn't have an ISC.

At a defined cell's SOC/SOD, the OCV relaxation profile following a charge or discharge is different in cells having an ISC and cells not having an ISC.

The measured differences in the thermodynamics and kinetics data between cells having and not having an ISC are greater than the error bar, which enables an ISC to be detected.

A method and a system have been developed by the Applicant based on thermodynamics and kinetics data collection and analysis to detect an ISC in a battery cell.

Thermodynamics and kinetics data can be recorded and processed online owing to a smart chip attached to a single cell and a plurality of cells.

The smart chip consists of an integrated circuit with a processor and communication capabilities such as infra-red communication.

The smart chip is part of a system aimed as detecting an ISC is a cell.

The method and system for ISC detection described herein apply to any type of electrochemical cell chemistry, such as primary cells (non-rechargeable) and secondary cells (rechargeable).

It is clearly shown that both thermodynamics data profile for each state of charge and OCV are different when a cell has an internal short circuit (ISC) (Cases 1000, 100, 10 and 1) vs. when it doesn't have ISC (Case The difference between thermodynamics data in a cell having or not having an ISC depend on the SOC, SOH (aged cells) and temperature.

For a well-defined cell chemistry and SOH, there are specific OCVs where the differences in thermodynamics data and/or kinetics data are more important.

One way to detect an ISC involves bringing the cell to one of the specific OCVs and measuring OCV vs. T relaxation profiles about that specific OCV.

A second way to detect an ISC involves bringing the cell to one of the specific SOCs/SODs and measuring OCV vs. T relaxation profiles about that specific SOC/SOD.

The voltage relaxation profile analysis at specific OCVs and specific SOCs/SODs provides an accurate tool to detect an ISC.

Entropy and enthalpy data vs. SOC/SOD and vs. OCV are also sensitive to the presence of an ISC when compared to base data when no ISC is present in the cell.

The new method herein disclosed applies to all types of battery chemistries.

$$U(t) = U_0 + A_1 e^{-\frac{t}{t_1}} \tag{6}$$

Three fitting parameters are computed: $U_0$, $A_1$ and $t_1$.

Parameters vary according to cells with and without ISC, especially the $t_1$ parameter.

BRIEF DESCRIPTION OF THE DRAWINGS

These and other features and advantages of the present disclosure will become better understood with regard to the following description, appended claims, and accompanying drawings wherein:

FIG. 14 is a Table with OCV vs. time fitting parameters $U_o$, $A_1$ and $t_1$.

Two series of tests have been conducted on lithium-ion batteries of about 600 mAh rated capacity from two different origin and chemistry, cells A and cells B. FIG. 2 to FIG. 10 show test results on cells A and FIG. 11 to FIG. 45 are test results on cells B.

DETAILED DESCRIPTION

Figure 1:
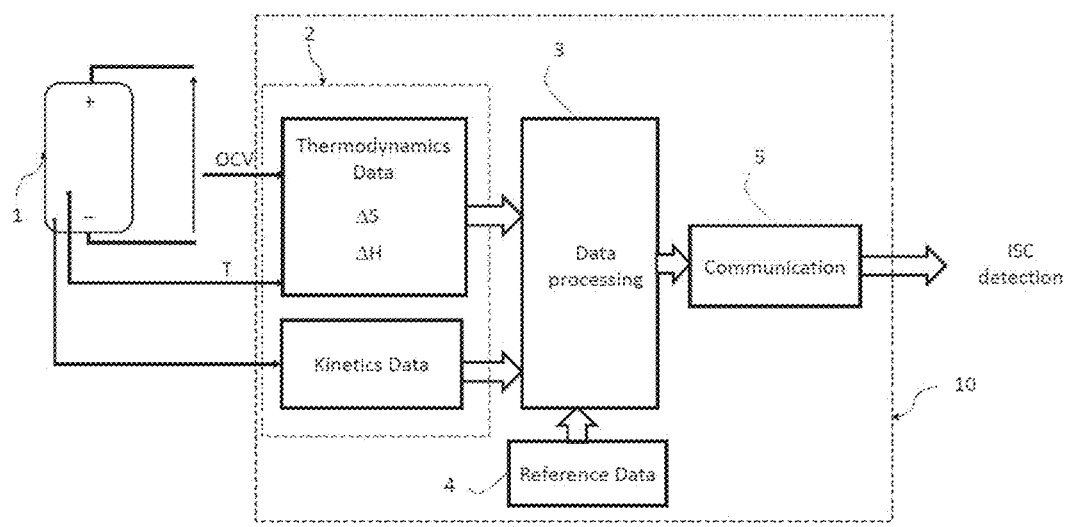
FIG. 1 is a functional scheme of an ISC detection system and method according to the present disclosure.

With reference to FIG. 1, an ISC detection system 10 is implemented to detect a possible internal short circuit within an electrochemical cell 1, such as, for example, a LIB cell rated 600 mAh. The detection system 10 comprises a unit 2 for measuring (i) evolutions of open circuit voltage OCV and temperature T as a function of time in order to obtain thermodynamics data and (ii) kinetics data on the electrochemical cell 1, a data processing unit 3 receiving the thermodynamics and kinetics data and processing them in comparison with reference or base data 4 related to a nominal electrochemical cell, and a wireless communication unit 5 provided for transmitting ISC detection data to a remote control system.

To simulate an ISC, cells A and cells B are loaded with external resistances ($R_{Ex}$) (as in the schematics).

For cells A:
1 kΩ (case 1),
10 kΩ (case 10),
1000 kΩ (case 100),
1000 kΩ (case 1000),
∞kΩ (case infinite, no ISC), Cells without resistance (case infinite) are tested as base cells, and Four identical cells are used for each test with and without external resistances $R_{Ex}$ for data reproducibility check.

For cells B:
1000 kΩ Cell 1 and Cell 2 in CH1 and CH2, respectively
100 kΩ Cell 3 and Cell 4 in CH3 and CH4, respectively, and
10 kΩ Cell 5 and Cell 6 in CH5 and CH6, respectively.
(CHn=test channel 'n' of the BA3000 machine, 1≤n≤6).

Prior to attaching (or not attaching) an external resistance to the cells, cells are either fully charged or fully discharged at the ambient temperatures (~25° C.) using an Arbin battery cycler (at C/6 rate, here 100 mA).

Once a cell is fully charged or discharged a resistance is then attached to the cell, then cell is transferred to the BA 3000 machine for immediate thermodynamics and kinetics data measurements under the following protocol:

Fully charged cells are discharged from 100% SOC to 0% SOC by 5% steps. In each step, discharge current of 100 mA is applied for 18 minutes followed by rest. Discharging was continued until cell voltage reached 2.5 V cut-off voltage.

Fully discharged cells are charged from 0% SOC to 100% SOC to by 5% steps. In each step charge current of 100 mA is applied for 18 minutes followed by rest. Charging was continued until cell voltage reached 4.2 V cut-off voltage.

After each charge and discharge step OCV is monitored at the ambient temperatures until OCV stabilized (voltage relaxation typically takes about 30 min).

Temperature was then deceased by 5° C. steps from the ambient 25° C. to 20° C., 15° C. and 10° C. then back to ambient. At each temperature OCV was measured until it stabilized (here, voltage relaxation typically takes about 20 minutes).

The OCV vs. T data enable entropy and enthalpy to be measured according to Equations (3) and (4).

Experimental for Thermodynamics Data

Thermodynamics data consist of OCV, entropy and enthalpy data plots versus discharge capacity, SOC/SOD for the OCV and versus SOC and OCV for entropy and enthalpy, including (entropy, enthalpy, SOC) 3D plots. This is illustrated in FIG. 2 to FIG. 7 for Cells A and in FIG. 15 to FIG. 45 for Cells B.

OCV Profiles

Figure 2:
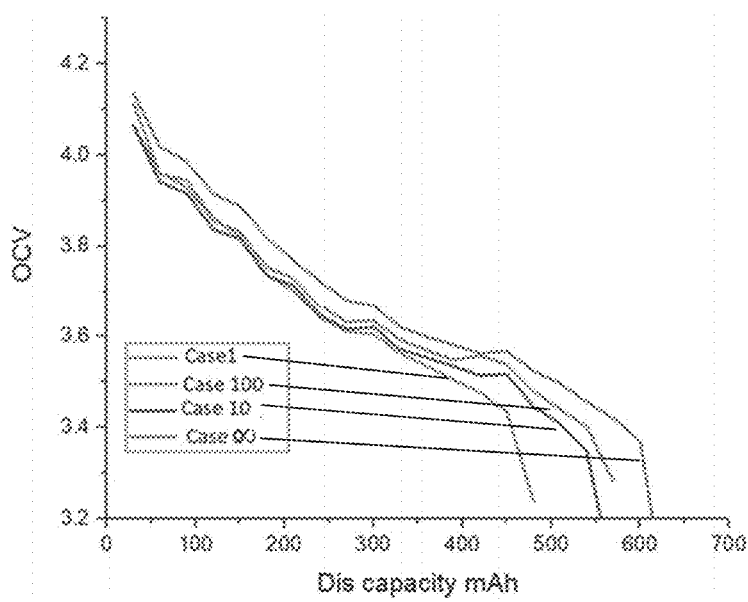
FIG. 2 illustrates OCV vs. capacity.
Figure 3:
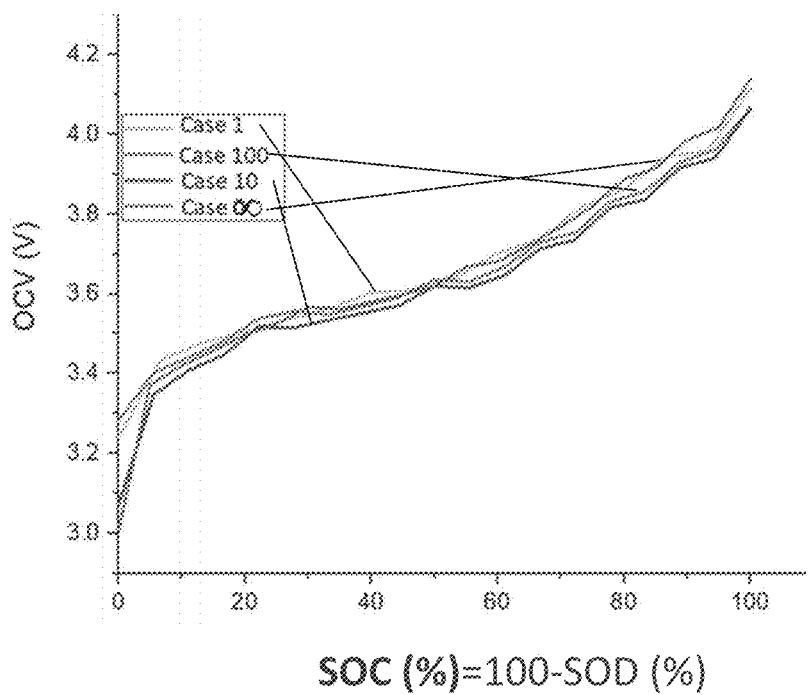
FIG. 3 is a graph of OCV vs SOC.
Figure 45:
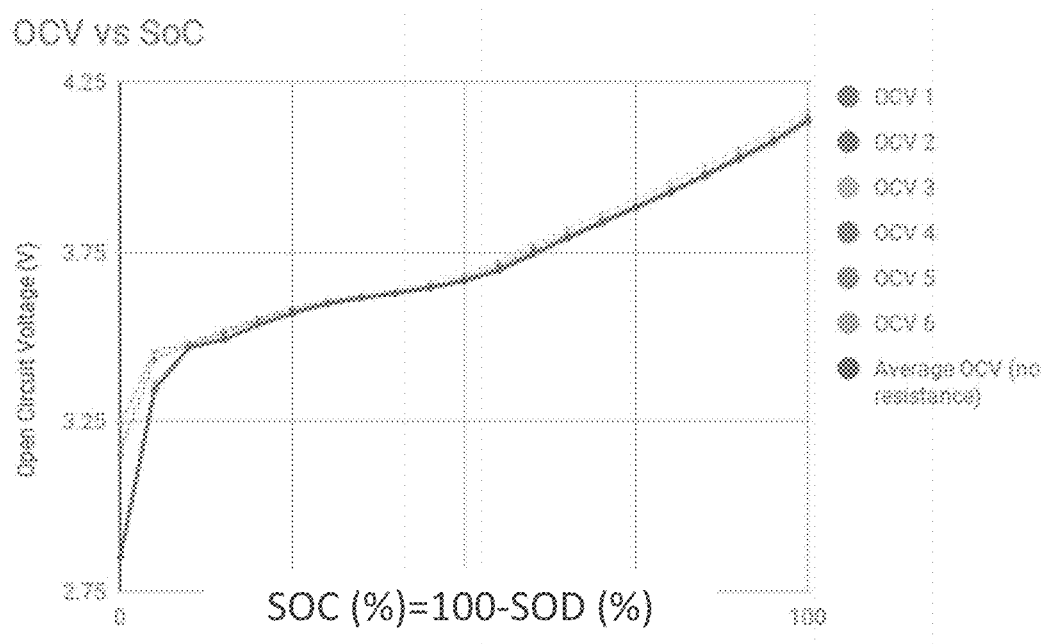
FIG. 45 is a graph of OCV vs. SOC profiles of 6 cells with ISC (CH 1 to CH6) and the reference cell (average entropy no ISC).

The OCV vs. capacity of FIG. 2 and OCV vs. SOC of FIG. 3 for cells A and the OCV vs. SOC of FIG. 45 for cells B show differences in OCV profiles between cells with simulated ISC (cases 1, 10, 100, 1000 for cells A and cells 1 to 6 (CH1 to CH6) for cells B and cells without ISC (case 0.0 cell A, and "average" for cells B). Differences in OCV profiles can be used to detect an ISC, although to less extent than entropy and enthalpy profiles as will be illustrated in the next section.

Enthalpy (ΔH) Profiles

Figure 4:
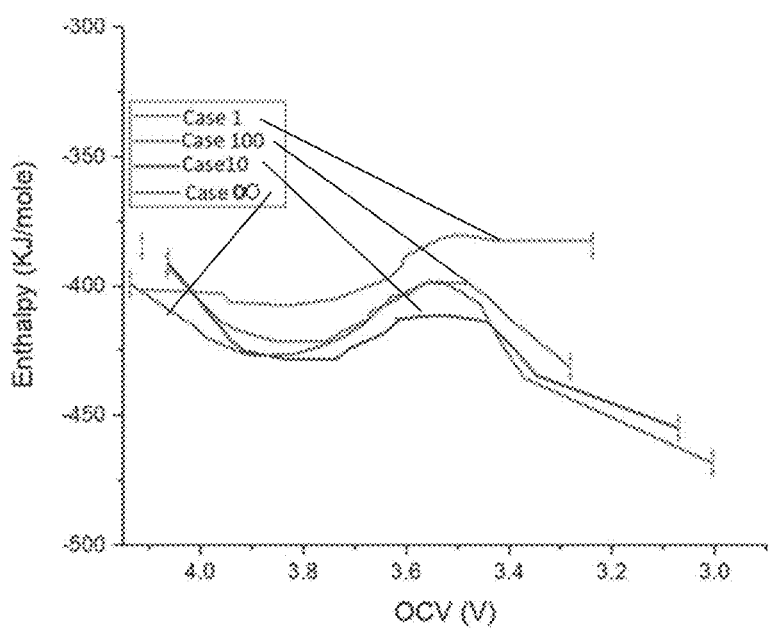
FIG. 4 is a graph of enthalpy vs OCV.
Figure 42:
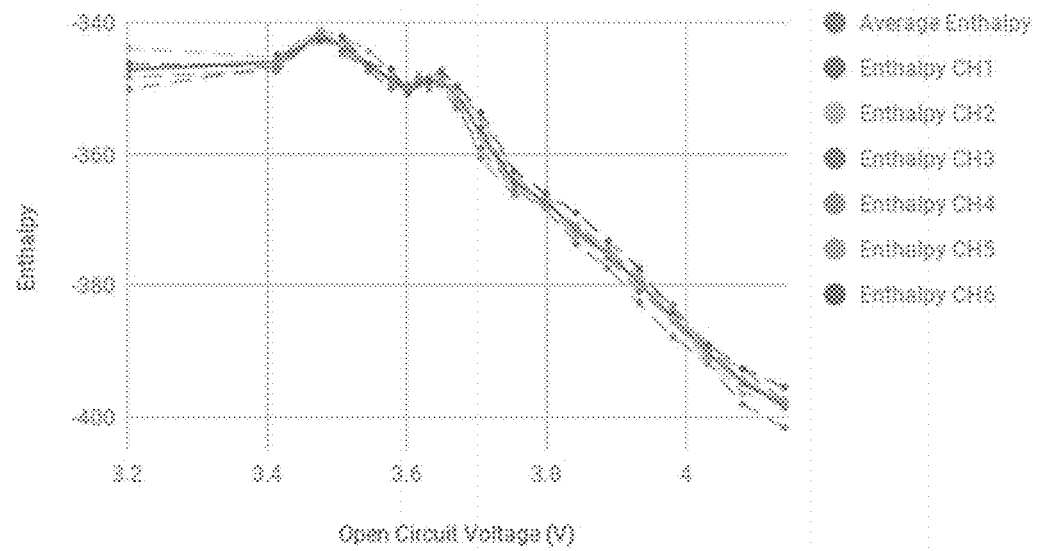
FIG. 42 is a graph of Enthalpy vs. OCV profiles of 6 cells with ISC (CH 1 to CH6) and the reference cell (average entropy no ISC), FIG. 43 graph of Entropy vs. SOC profiles of 6 cells with ISC (CH 1 to CH6) and the reference cell (average entropy no ISC)

Enthalpy vs. OCV profiles are illustrated in FIG. 4 for cells A and in FIG. 42 for cells B.

Figure 6:
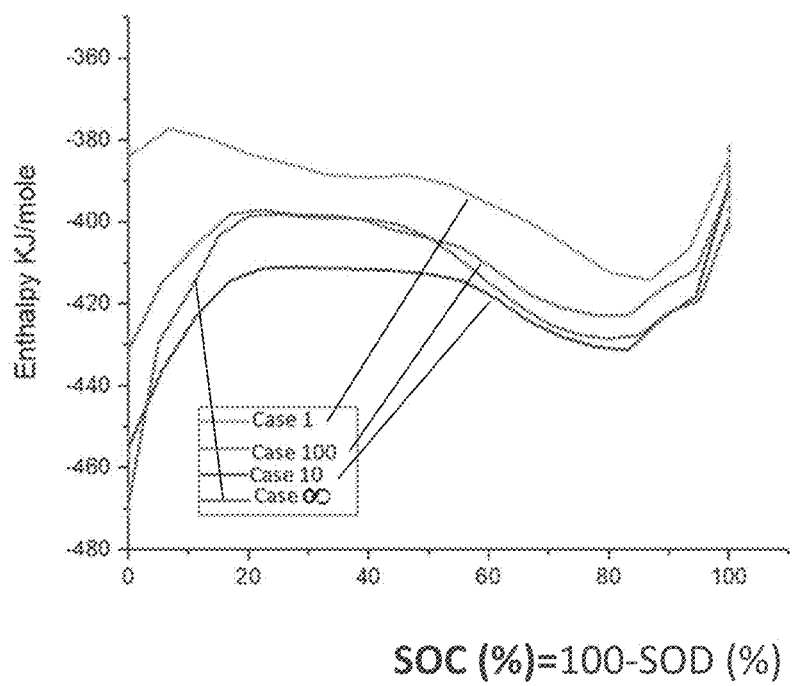
FIG. 6 is a graph of enthalpy vs SOD.
Figure 41:
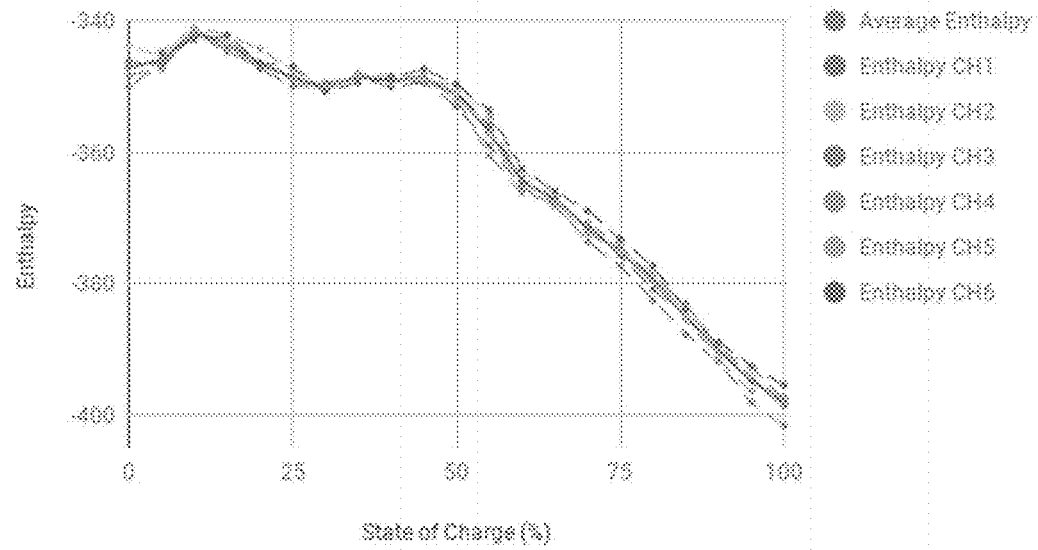
FIG. 41 is a graph of Enthalpy vs. SOC profiles of 6 cells with ISC (CH 1 to CH6) and the reference cell (average entropy no ISC)

Enthalpy vs. SOC profiles are illustrated in FIG. 6 for cells A and in FIG. 41 for cells B.

The difference in the enthalpy profiles both vs. OCV and vs. SOC between cells with simulated ISC and without ISC is significantly larger than in the OCV profiles presented above. Accordingly, enthalpy profile analysis is useful for ISC detection.

Enthalpy profiles of cells A and cells B both vs. OCV and vs. SOC are significantly different due to differences in cells A and B chemistry and/or construction.

Entropy (ΔS) Profiles

Figure 5:
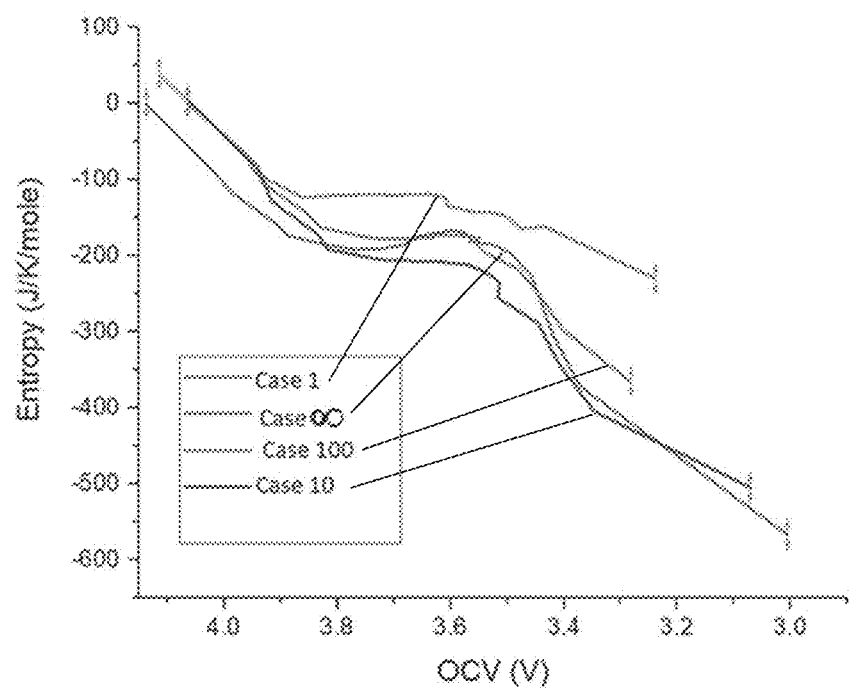
FIG. 5 is a graph of entropy vs OCV.
Figure 44:
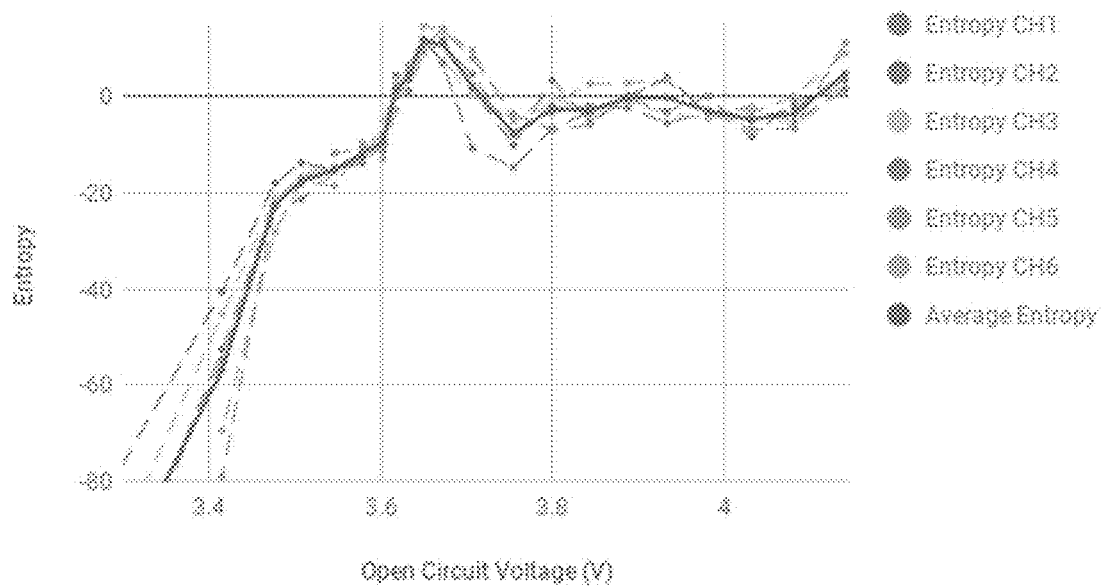
FIG. 44 is a graph of Entropy vs. OCV profiles of 6 cells with ISC (CH 1 to CH6) and the reference cell (average entropy no ISC)

Entropy vs. OCV profiles are illustrated in FIG. 5 for cells A and in FIG. 44 for cells B.

Figure 7:
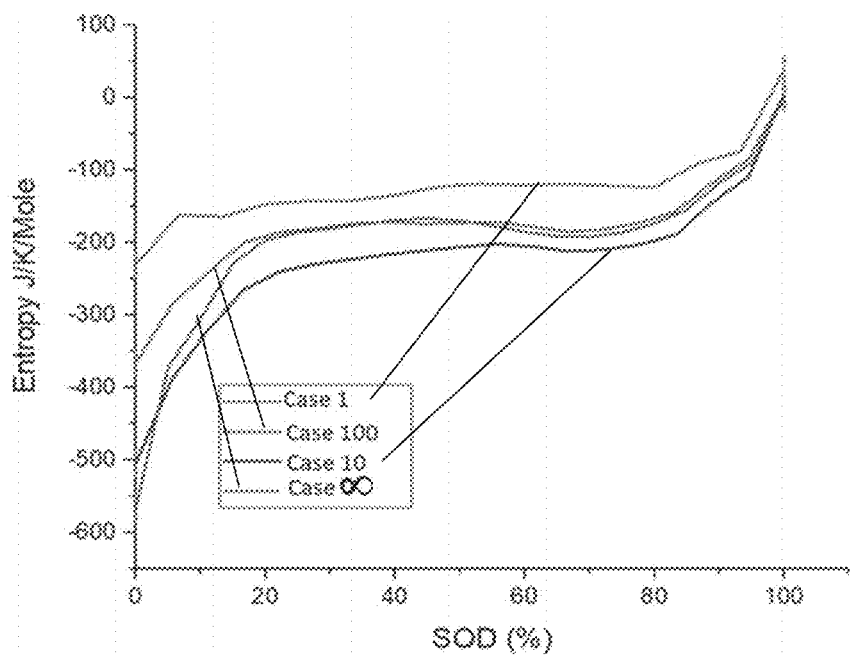
FIG. 7 is a graph of entropy vs SOD.
Figure 43:
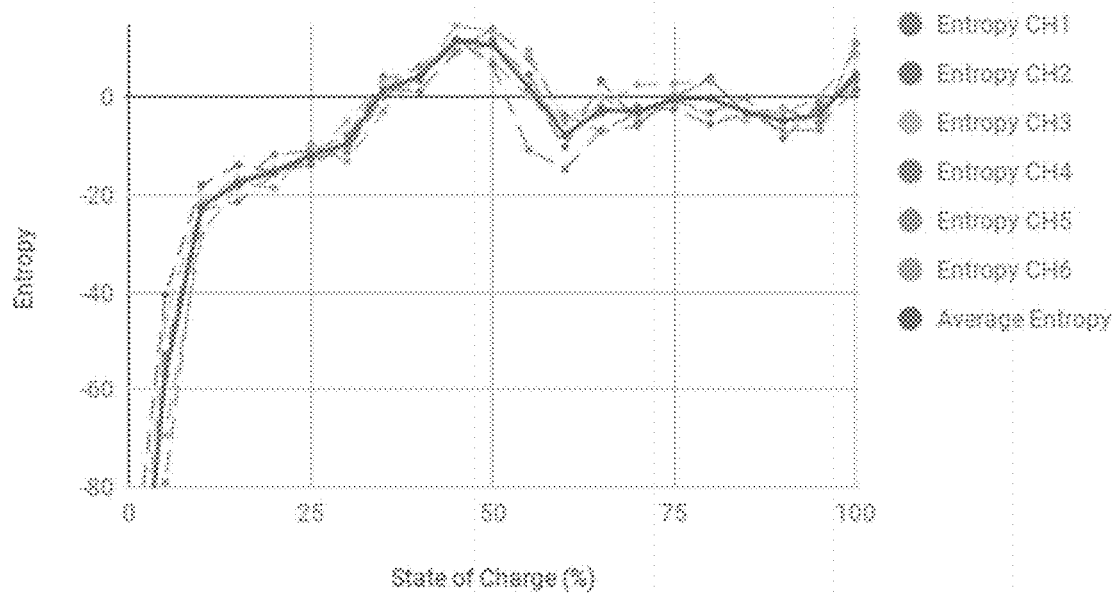

Entropy vs. SOC profiles are illustrated in FIG. 7 for cells A and in FIG. 43 for cells B.

The difference in the entropy profiles both vs. OCV and vs. SOC between cells with simulated ISC and without ISC is significantly larger than in the OCV profiles presented above. Accordingly, entropy profile analysis is useful for ISC detection.

Here too entropy profiles of cells A and cells B both vs. OCV and vs. SOC are significantly different due to differences in cells A and B chemistry and/or construction.

Entropy (ΔS), Enthalpy (ΔH), SOC Profile

Entropy (ΔS), Enthalpy (ΔH), SOC 3D full profiles of cells B #1 to #6 with ISC and without ISC are shown in FIGS. 15, 18, 21, 24, 27 and 30, respectively.

Entropy (ΔS), Enthalpy (ΔH), SOC 3D zoom profiles of cells B #1 to #6 with ISC and without ISC are shown in FIGS. 17, 20, 23, 26, 29 and 32, respectively. Zoom profiles highlight differences between cells with and without ISC.

Figure 39:
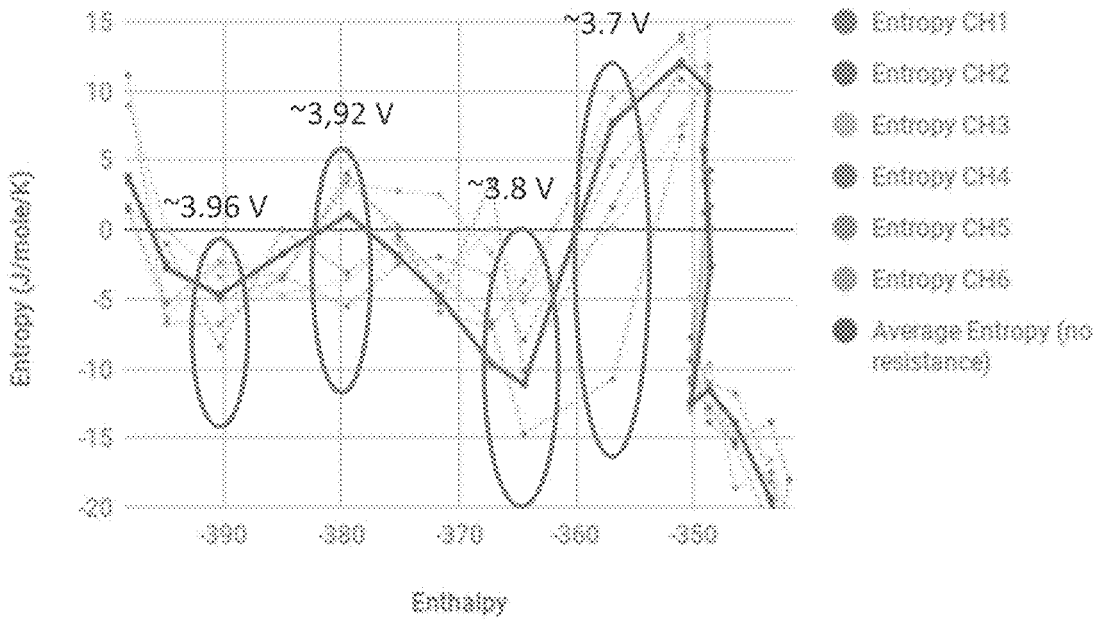
FIG. 39 shows the particular OCVs at which the entropy makes substantial differences between the 6 cells with ISC (CH 1 to CH6) and the reference cell (average entropy no ISC)
Figure 40:
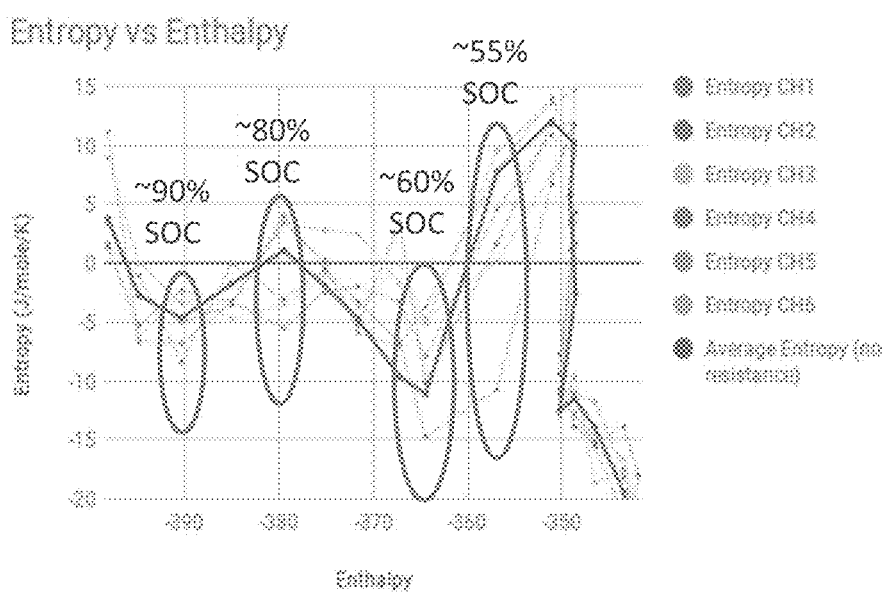
FIG. 40 shows the particular SOCs at which the entropy makes substantial differences between the 6 cells with ISC (CH 1 to CH6) and the reference cell (average entropy no ISC)

Entropy (ΔS), Enthalpy (ΔH), SOC profiles 2D projection on the (Entropy, Enthalpy) plane of cells B #1 to #6 with ISC and without ISC are shown in FIGS. 16, 19, 22, 25, 28 and 31, respectively. These entropy vs. enthalpy 2D presentation highlights much better differences between cells with simulated ISC and without ISC. Enthalpy domains where entropy data differences between cells with and without ISC are larger, are clearly circled in FIGS. 16, 19, 22, 25, 28 and 31. These specific enthalpy domains are useful for ISC detection. These specific enthalpy domains correspond to specific OCV domains and SOC domains of the cells as shown in FIGS. 5 and 6 for cells A and in FIGS. 41 and 42 in cells B. FIG. 39 shows the OCV domain average values where the difference between cells with and without ISC are larger, which are 3.7V, 3.8V, 3.92V and 3.96V for cells B. FIG. 40 shows the SOC domain average values where the difference between cells with and without ISC are larger, which are 55%, 60%, 80%, 90%.

Here, it should be emphasized that the specific OCV and SOC values useful for ISC online detection are: 1) average values within an OCV domain and an SOC domain, 2) cells chemistry and state of health (SOH) dependent.

Accordingly, for a specific cell's chemistry and cell's SOH, a method for ISC detection may consist of driving the cell voltage to one of the average OCV values such as 3.7V, 3.8V, 3.92V and 3.96V for cells B and measure entropy and enthalpy data around that specific OCV value. If the difference in entropy is higher than an error bar, then it is very highly likely the cell has an ISC. Similarly, another method for ISC detection consists of driving the cell to a specific SOC and measure entropy and enthalpy at that SOC. If the difference in entropy is higher than an error bar, then it is very highly likely the cell has an ISC.

An illustration of embodiments of the present disclosure on the ISC detection method and system is illustrated in FIGS. 34 to 38, which shows the differential entropy data between cells with and without ISC vs. OCV. Differential entropy at each OCV is given by the Equation:

$$\Delta(\Delta S(OCV)) = |\Delta S_{ISC}(OCV) - \Delta S_{no\text{-}ISC}(OCV)|, \quad (8)$$

in which | | is the absolute value symbol, $\Delta S_{ISC}(OCV)$ is the entropy of a cell with ISC at OCV and $\Delta S_{no\text{-}ISC}(OCV)$ is the entropy of a cell without ISC at same OCV.

FIGS. 34 to 38 show maxima at specific OCV values. These specific OCV values can be used to detect online an ISC in a cell by entropy measurement and comparison with a standard cell without ISC.

SOC Vs. Entropy ($\Delta S$) and Enthalpy ($\Delta H$)

In a patent application PCT/IB2018/059751, a method and system are disclosed for online determination of the SOC of primary and rechargeable batteries using and empirical Equation:

$$SOC = \alpha + \beta \Delta S + \gamma \Delta H, \quad (7)$$

where $\alpha$, $\beta$ and $\gamma$ coefficients are specific to a battery chemistry and SOH.

Here the SOC of cells B with and without ISC are fitted with Eq. (7). FIGS. 17, 20, 23, 26, 29 and 32 show the $\alpha$, $\beta$ and $\gamma$ coefficients for the SOC best simulation for cells B #1 to #6, respectively.

TABLE 1 below summarizes the achieved fitting data together with the coefficient of determination $R^2$. It can be seen that the $\alpha$, $\beta$ and $\gamma$ coefficients are different according to the presence or the absence of an ISC. Accordingly, the SOC fit with Eq. 7 can be used as a method and system to detect an ISC in a battery cell. $\alpha$, $\beta$ and $\gamma$ coefficients can be used individually or in combination to detect an ISC by comparing with a standard cell without ISC.

| Cell # | α | β | γ | R² |
|---|---|---|---|---|
| No ISC | −434 | 0.679 | −1.35 | 0.98 |
| With ISC 1 | −440 | 0.83 | −1.37 | 0.98 |

-continued

| Cell # | α | β | γ | R² |
|---|---|---|---|---|
| 2 | −447 | 0.81 | −1.39 | 0.98 |
| 3 | −425 | 0.83 | −1.32 | 0.99 |
| 4 | −451 | 0.69 | −1.40 | 0.98 |
| 5 | −425 | 0.7 | −1.33 | 0.98 |
| 6 | −428 | 0.74 | −1.34 | 0.99 |

Experimental for Kinetics Data

Figure 8:
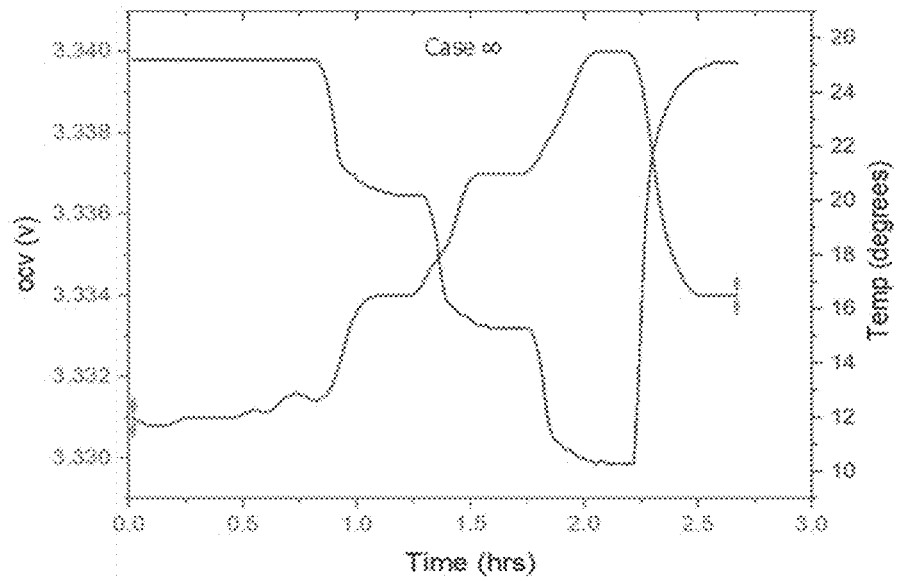
FIG. 8 is a graph of OCV vs Time, Temperature @0% SOC (charge), for the case ∞.
Figure 9:
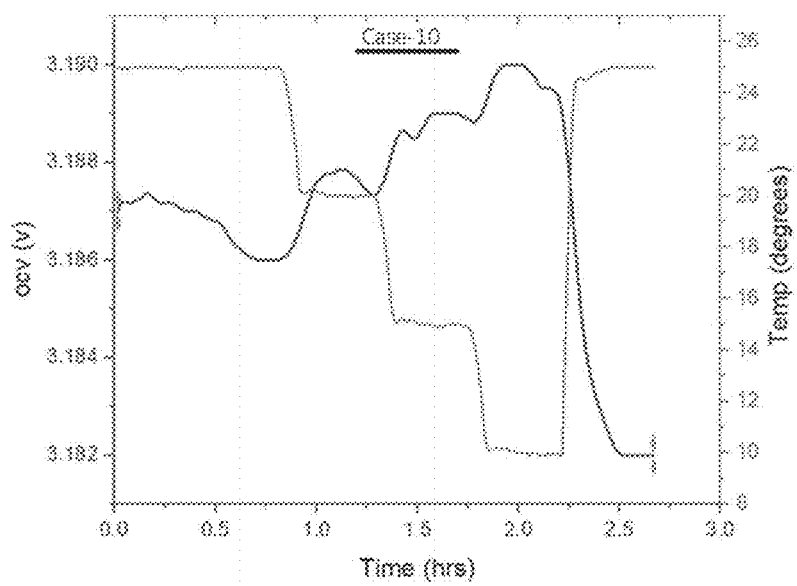
FIG. 9 is a graph of OCV vs Time, Temperature @0% SOC (charge), for case 10.
Figure 10:
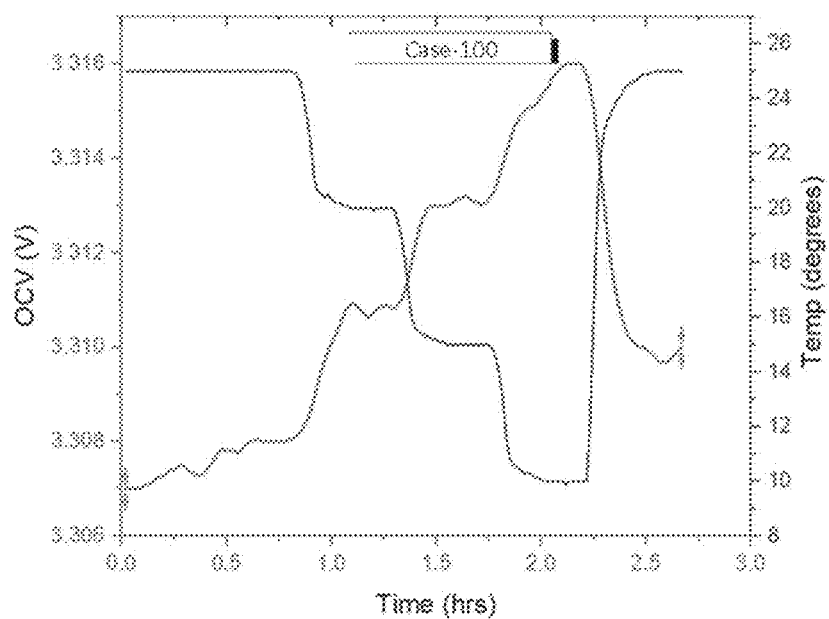
FIG. 10 is a graph of OCV vs Time, Temperature @0% SOC (charge), for case 100.

The OCV time dependence with temperature is illustrated in FIGS. 8, 9 and 10 for cells A of case 0.0, case 10 and case 100, respectively at a same SOC of 10%. These data are used for entropy and enthalpy determination according to Eq. 3 and 4, respectively. It can be easily seen that the OCV vs. time profile at each temperature is different whether cells are with ISC (case 10 and case 100) and without ISC (case ∞). Moreover, as shown in TABLES 2 below, the OCV after time relaxation at each SOC is different between cells with and without ISC. Accordingly, the OCV vs. time and temperature profiles are useful to detect an ISC in comparison with a cell without ICS. Also, the OCV at well-defined SOC after time relaxation is also indicative of the presence of an ISC.

TABLE 2

| Voltage @ 50% SOC during charge | |
|---|---|
| Batteries type | Average Voltage |
| Case 100 | 3.69 |
| Case 10 | 3.67 |
| Case ∞ | 3.67 |

| Voltage @ 75% SOC during charge | |
|---|---|
| Batteries type | Average Voltage |
| Case 100 | 3.89 |
| Case 10 | 3.862 |
| Case ∞ | 3.860 |

| Voltage @ 50% SOC during discharge | |
|---|---|
| Batteries type | Average Voltage |
| Case 1 | 3.6 |
| Case 100 | 3.638 |
| Case 10 | 3.631 |
| Case 0 | 3.66 |

| Voltage @ 25% SOC during charge | |
|---|---|
| Batteries type | Average Voltage |
| Case 100 | 3.6 |
| Case 10 | 3.59 |
| Case 0 | 3.59 |

| Voltage @ 75% SOC during discharge | |
|---|---|
| Batteries type | Average Voltage |
| Case 1 | 3.78 |
| Case 100 | 3.8 |
| Case 10 | 3.79 |
| Case ∞ | 3.86 |

| Voltage @ 25% SOC, OCV ~3.52 V | |
|---|---|
| Batteries type | Average Voltage (V) |
| Case 1 | 3.3 |
| Case 100 | 3.53 |
| Case 10 | 3.51 |
| Case ∞ | 3.569 |

Figure 11:
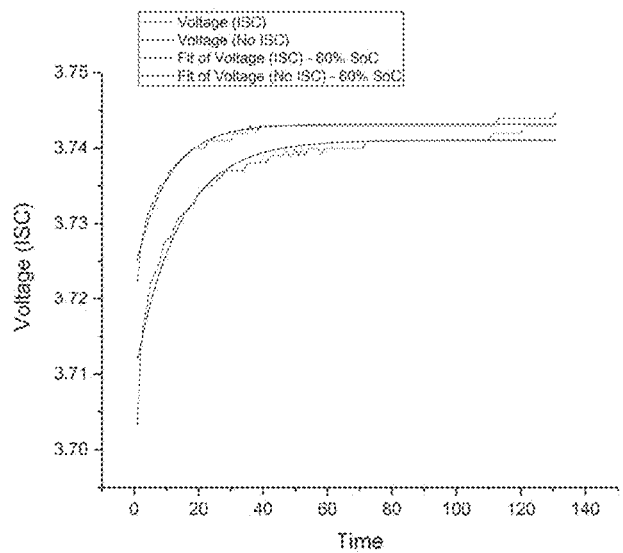
FIG. 11 is a graph of OCV vs Time @ 60% SOC with a fitted curve.
Figure 12:
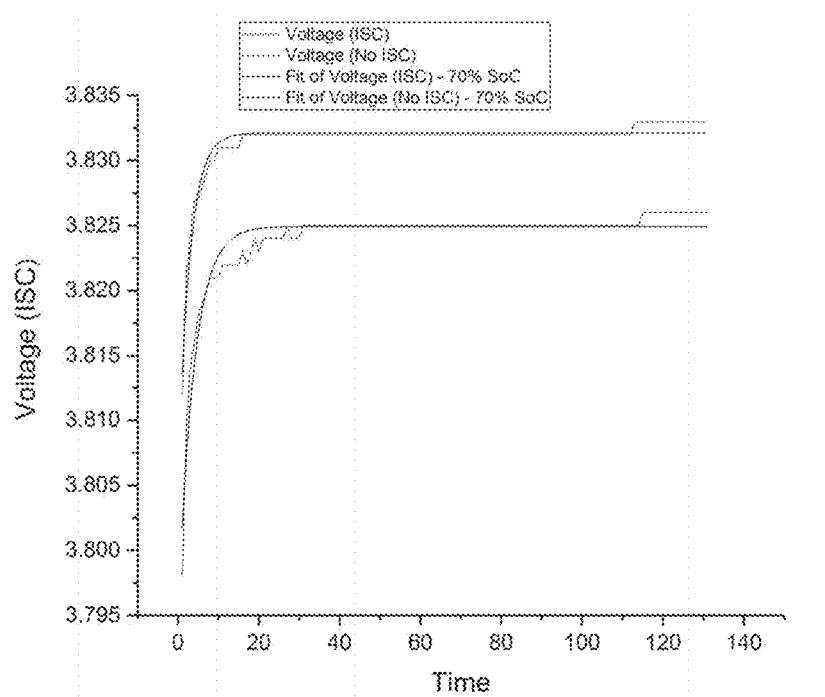
FIG. 12 is a graph of OCV vs Time @ 70% SOC with a fitted curve.
Figure 13:
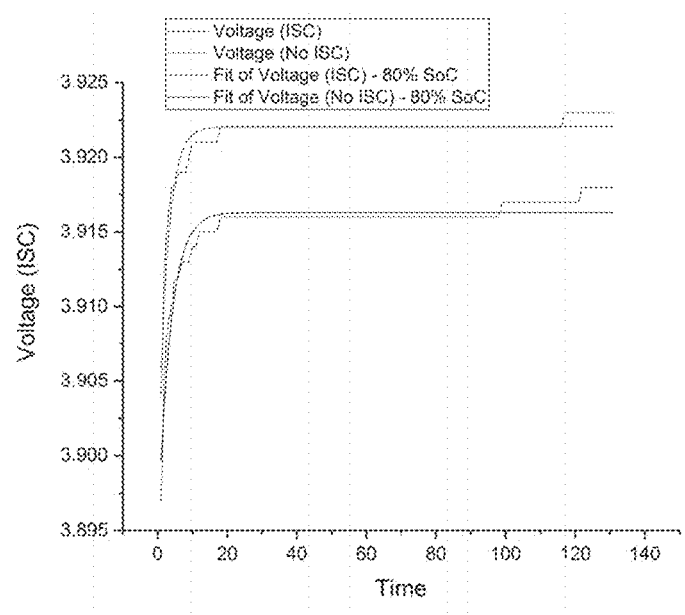
FIG. 13 is a graph of OCV vs Time @ 80% SOC with a fitted curve.
Figure 15:
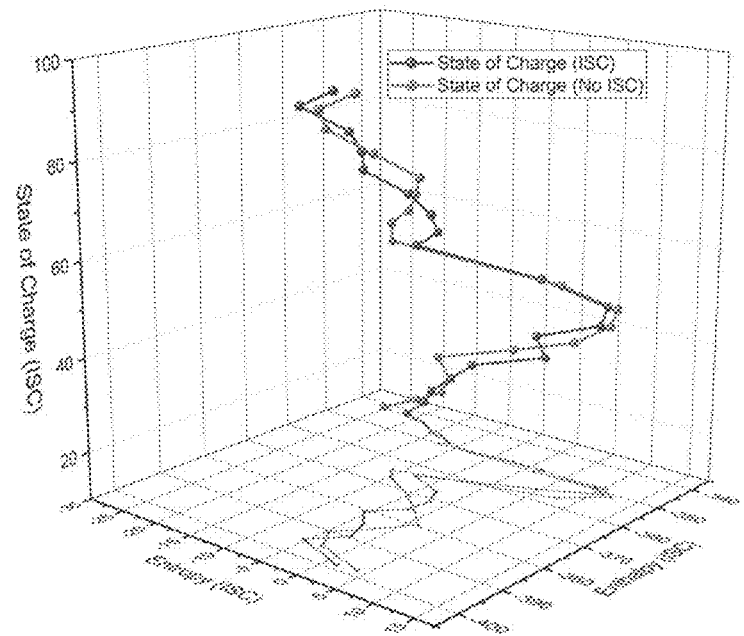
FIGS. 15 to 32 illustrate experimental 2D and 3D graphs using SOD and SOH for 6 cells.
Figure 16:
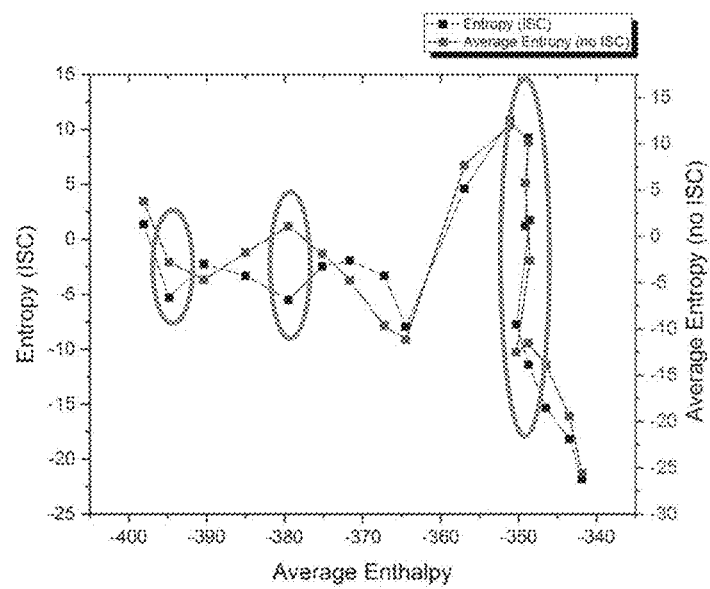
Figure 17:
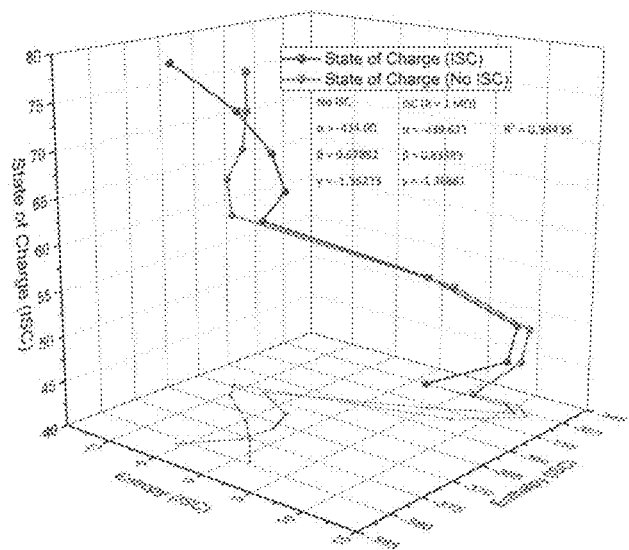
Figure 18:
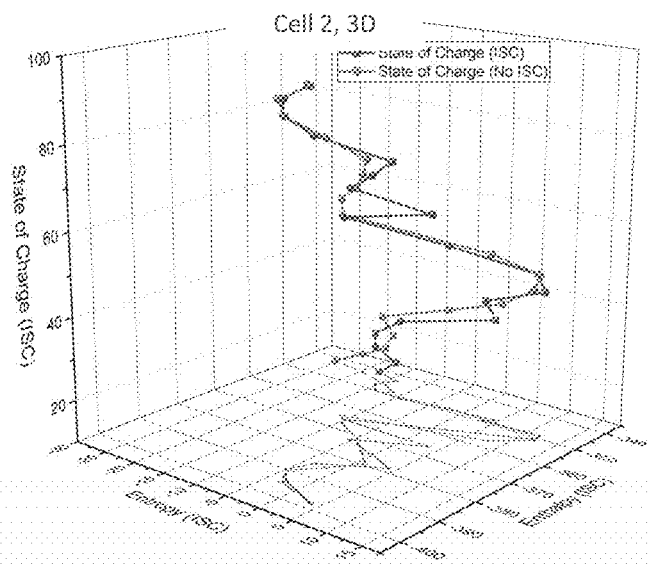
Figure 19:
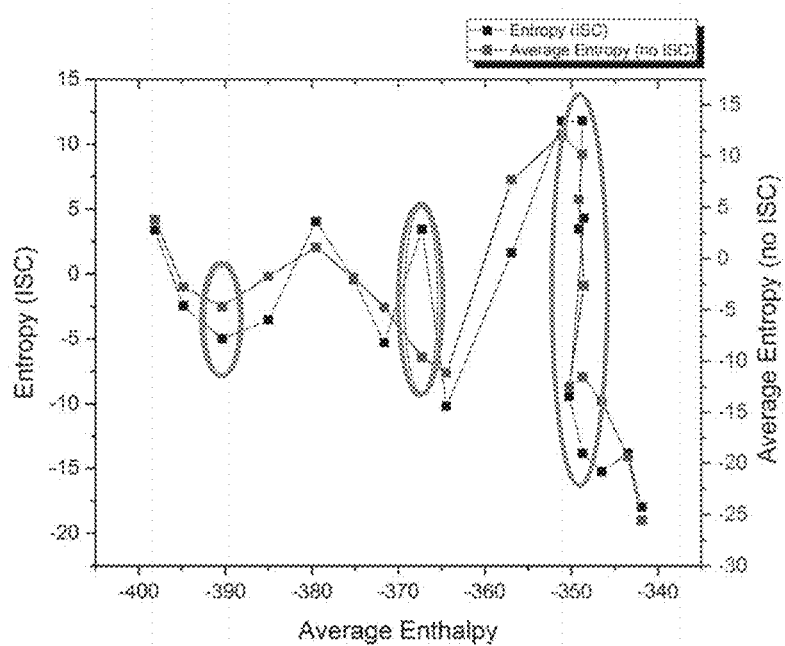
Figure 20:
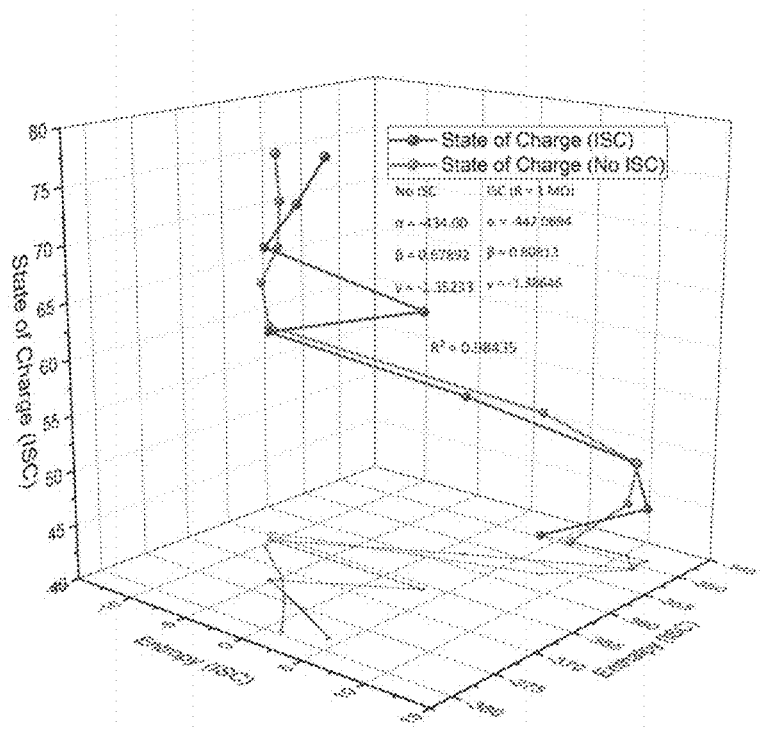
Figure 21:
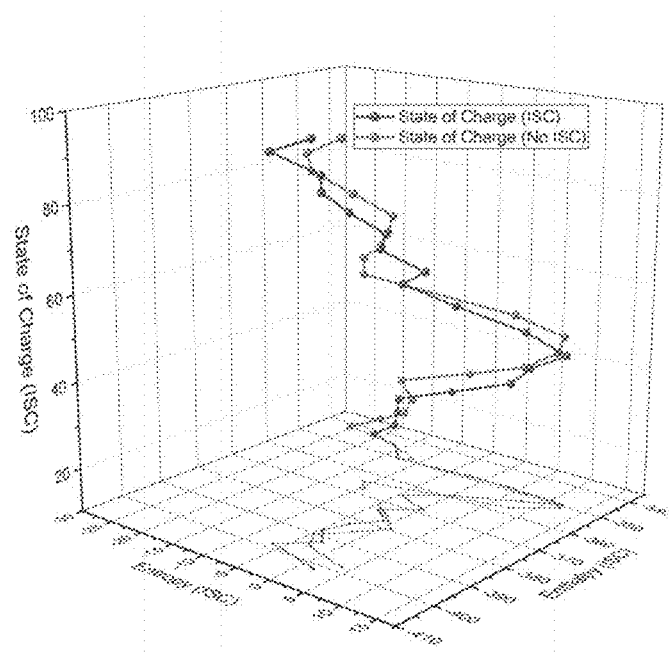
Figure 22:
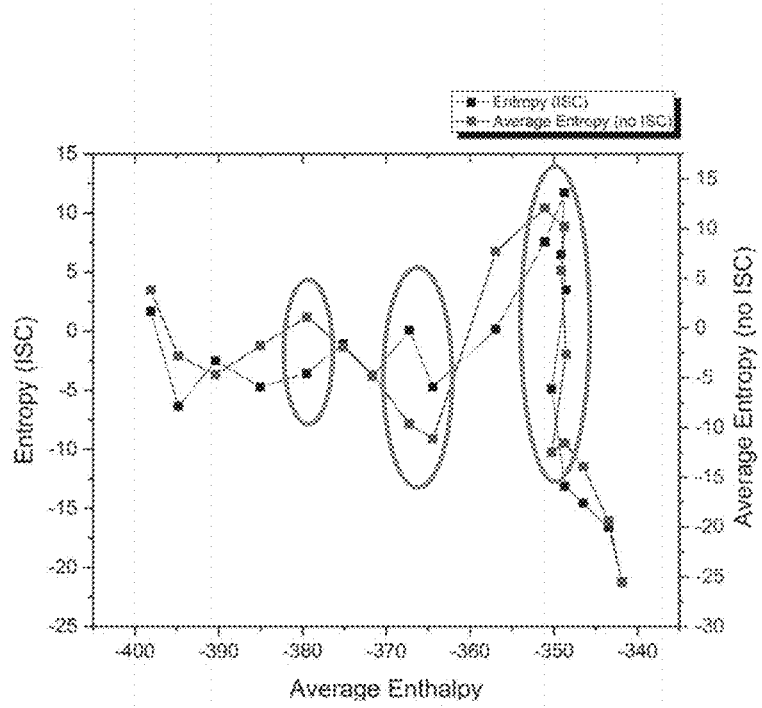
Figure 23:
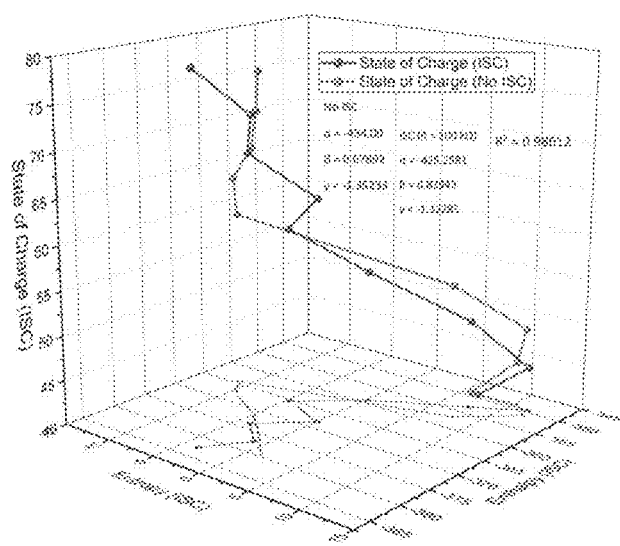
Figure 24:
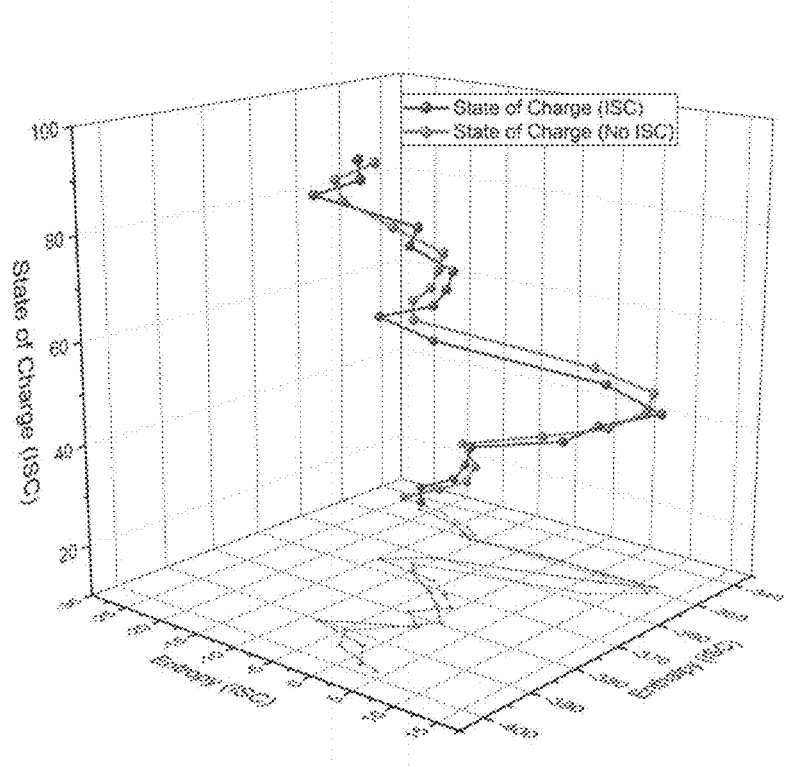
Figure 25:
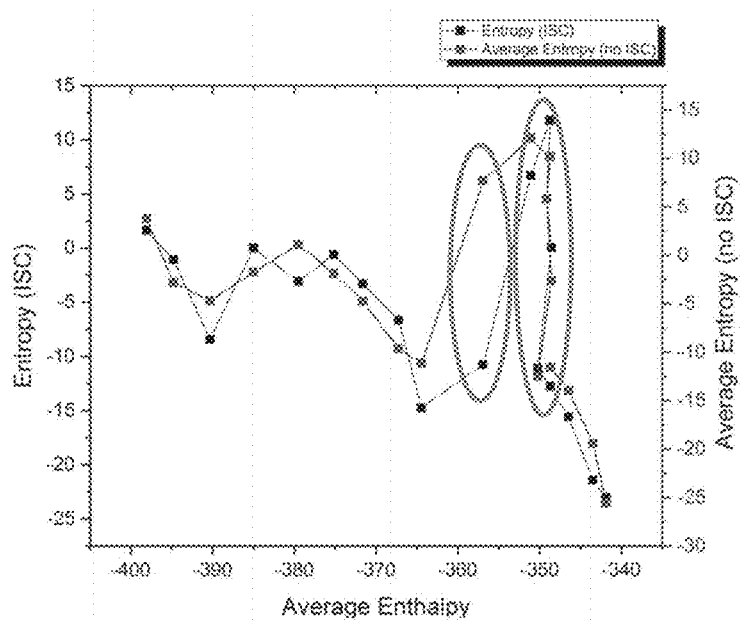
Figure 26:
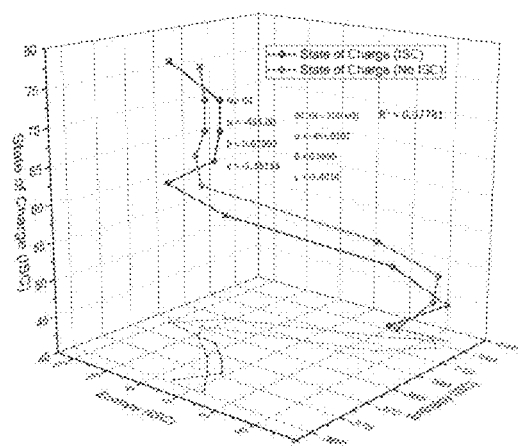
Figure 27:
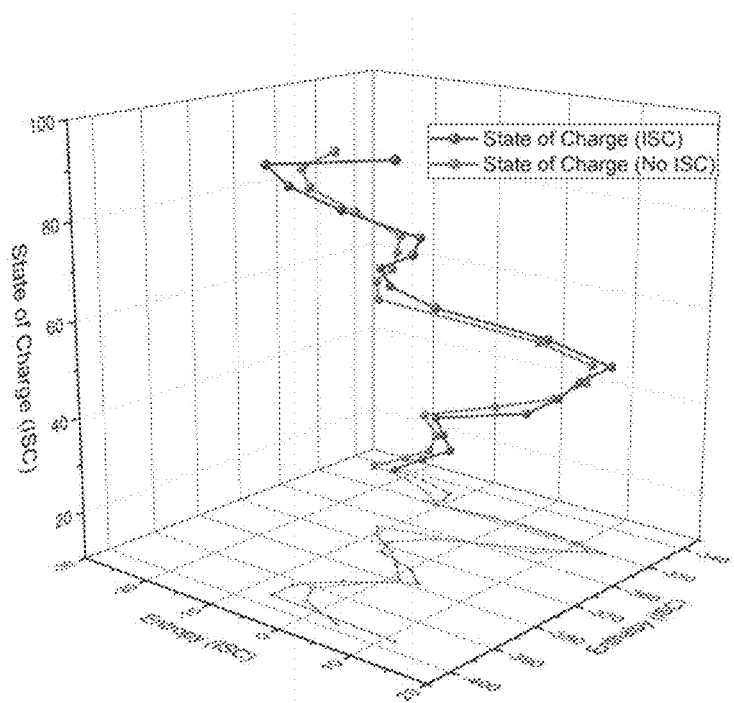
Figure 28:
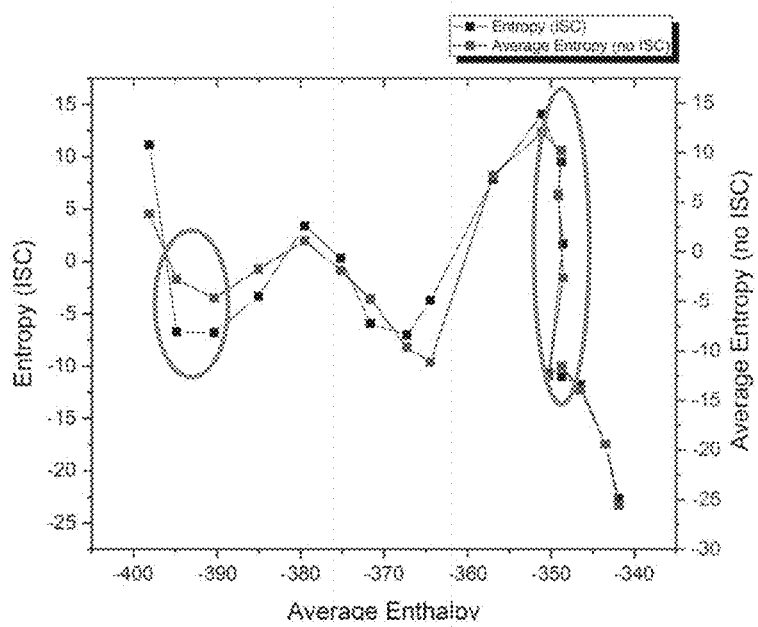
Figure 29:
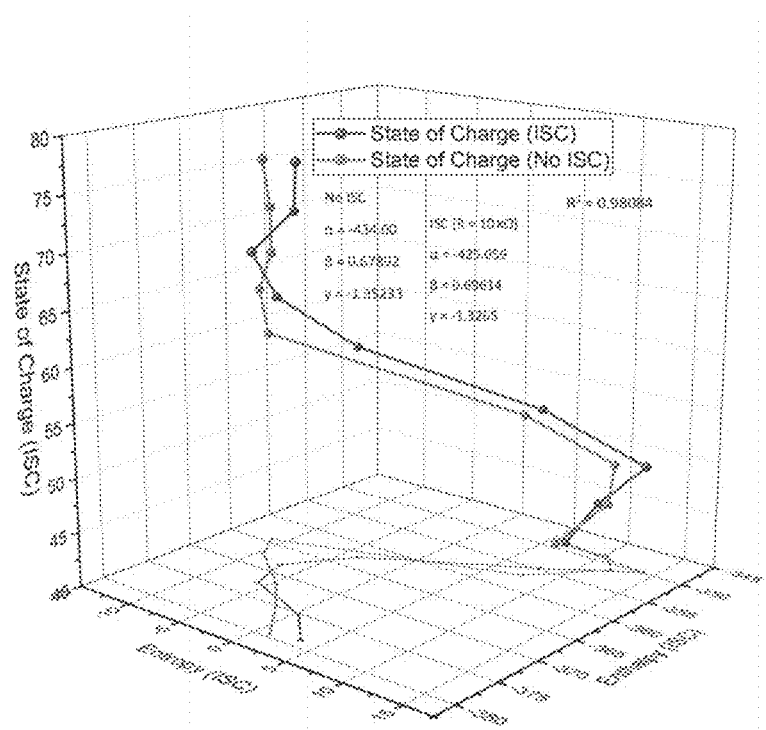
Figure 30:
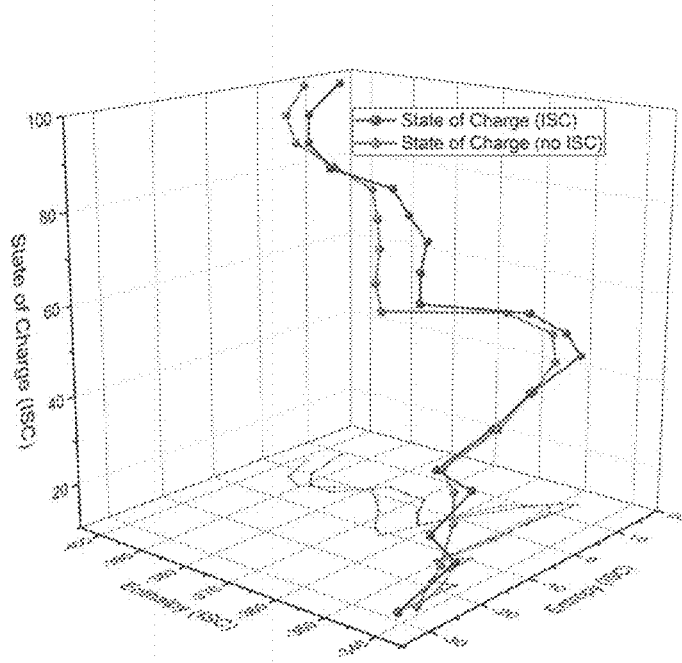
Figure 31:
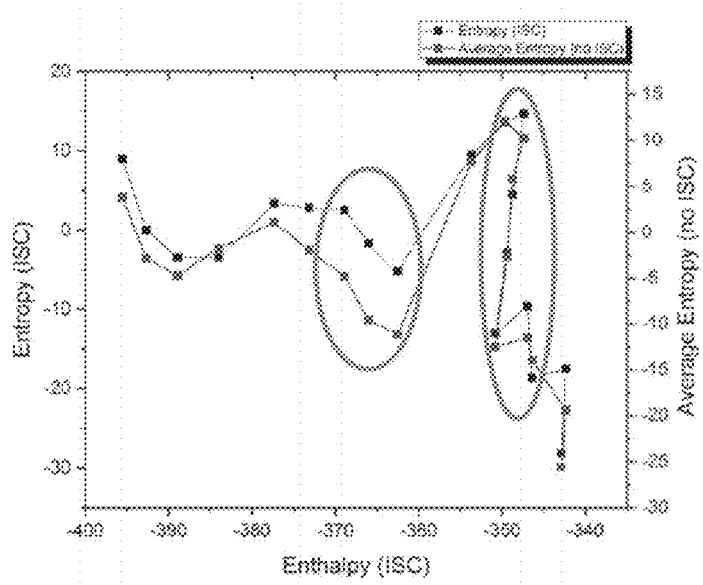
Figure 32:
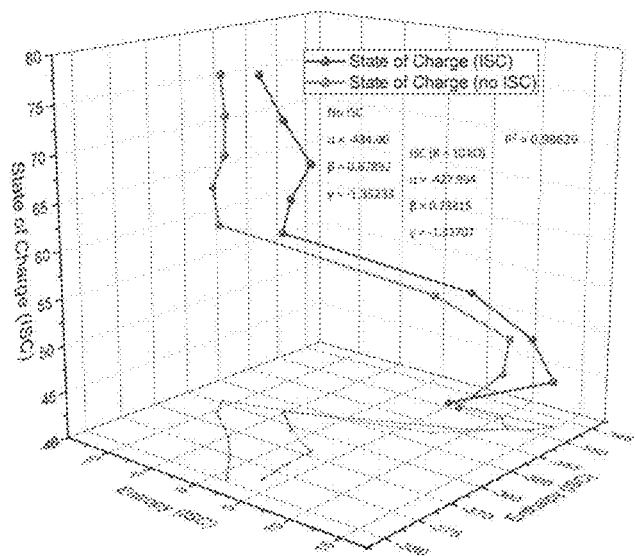
Figure 33:
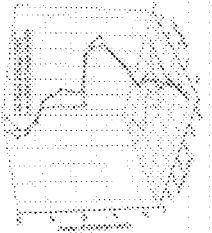
FIG. 33 is a summary table for the experiments of FIGS. 15-32, FIGS. 34 to 38 illustrate Differential Entropy vs. OCV for 5 cells with ISC.
Figure 34:
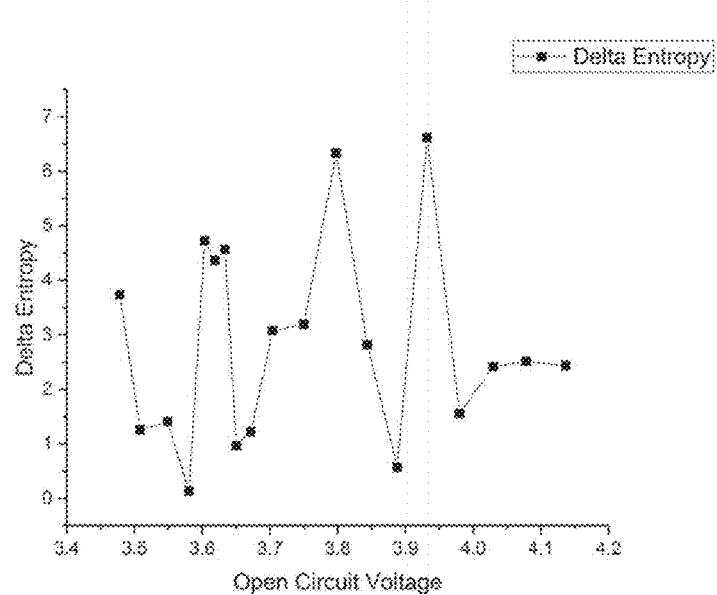
Figure 35:
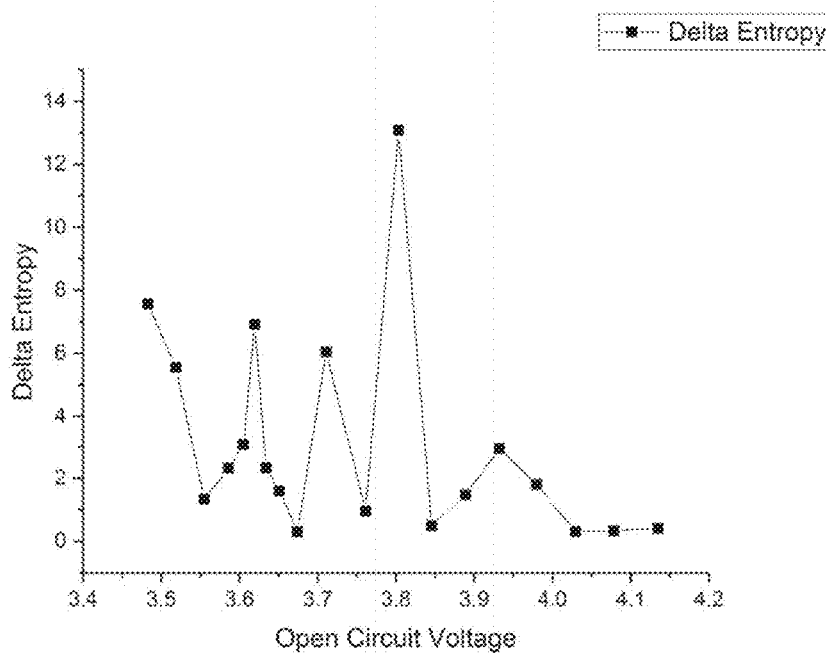
Figure 36:
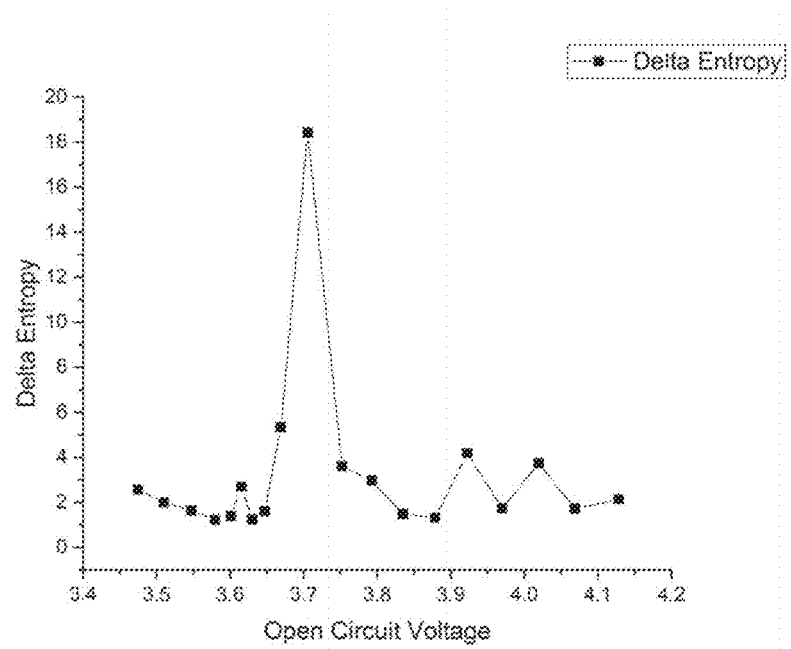
Figure 37:
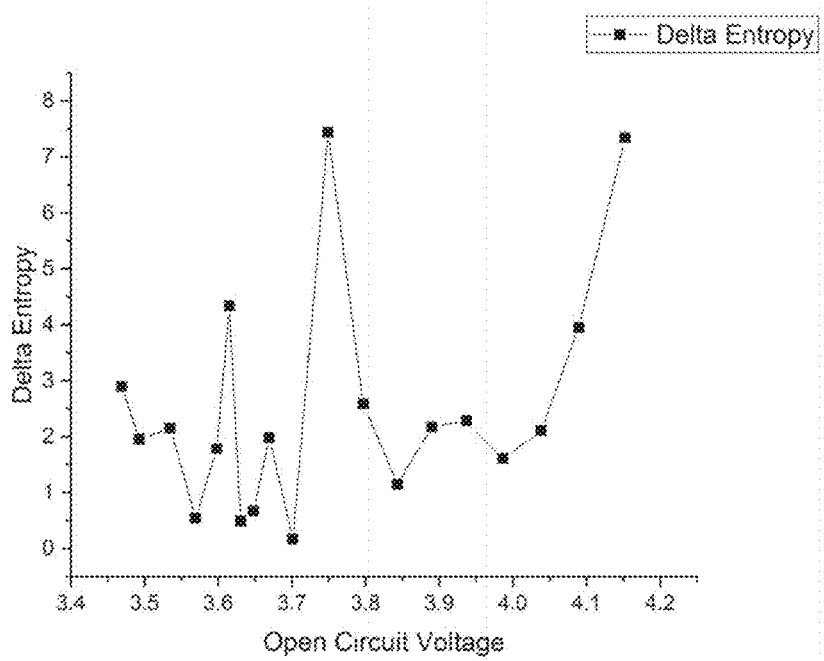
Figure 38:
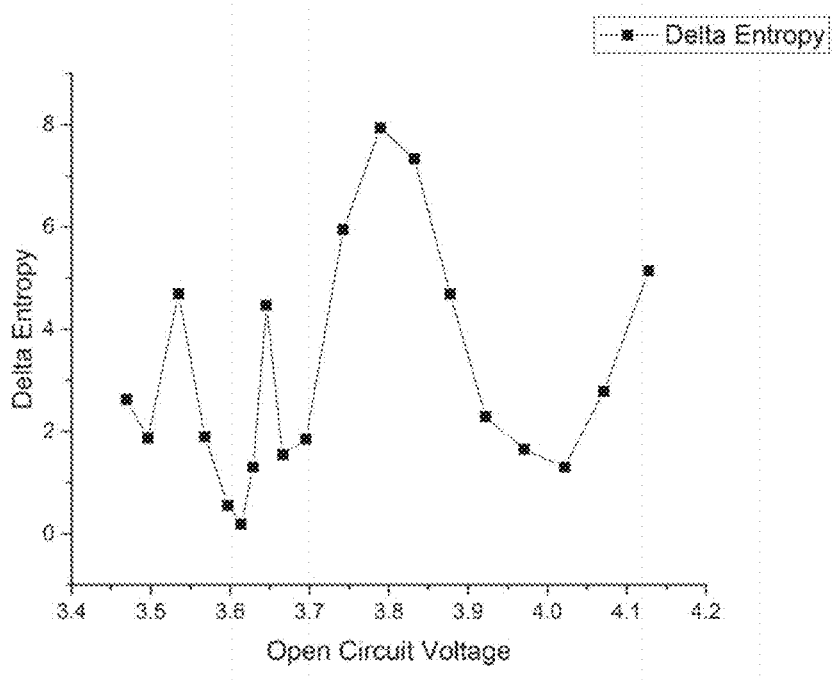

Another embodiment of the present disclosure is the data analysis and simulation of isothermal voltage relaxation profile following discharge at a specific SOC and OCV of cells with and without ISC. FIGS. 11, 12 and 13 show the OCV relation profile of cells B with ISC at SOC of 60%, 70% and 80% together with same profile of a cell B without ISC. The OCV profile during relaxation fitted well with the empirical Equation:

$$U(t) = U_0 + A_1 e^{-\frac{t}{t_1}} \quad (9)$$

where U(t)=time 't' dependent OCV, $U_0$=Equilibrium OCV (t=∞), $A_1$=pre-exponential coefficient and $t_1$=time constant.

Of course, the present disclosure is not limited to the above-described detailed embodiments and numerous other versions of the ISC detection method and system according to the present disclosure can be implemented without departing from the scope of the present invention as defined by the claims.

The invention claimed is:

1. A method for detecting an internal short circuit within an electrochemical cell, comprising: using on-line measuring and processing of thermodynamics data and kinetics data on the electrochemical cell,
wherein the thermodynamics data comprises open-circuit voltage data, entropy variations, enthalpy variations data, and combinations thereof,
wherein the kinetics data comprises cell voltage, cell temperature, cell internal resistance, cell current, and combinations thereof,
wherein the processing of the thermodynamics data and kinetics data includes comparing the measured thermodynamics and kinetics data to reference data related to a nominal electrochemical cell,
characterized in that it further comprises measuring relaxation profiles of the open-circuit voltage (OCV) of the electrochemical cell at different states of charge and temperatures of the electrochemical cell, and comparing the measured relaxation profiles to reference profiles of relaxation for the nominal electrochemical cell.

2. The method of claim 1, wherein the method is implemented using an integrated circuit for managing a single cell or a plurality of cells.

3. The method of claim 1, further comprising measuring entropy variations and/or enthalpy variations as a function of open circuit voltage profiles, and comparing the entropy variations and/or enthalpy variations to reference variation values for the nominal electrochemical cell.

4. The method of claim 1, further comprising:
bringing the electrochemical cell to a specific open-circuit voltage corresponding to differences in thermodynamics data and/or kinetics data, the specific open-circuit voltage being an average value within an open-circuit voltage domain, and
measuring relaxation profiles of the open circuit voltage as a function of temperature about the specific open-circuit voltage OCV.

5. The method of claim 1, further comprising measuring entropy data and/or enthalpy data as a function of a state of charge or a state of discharge of the electrochemical cell and as a function of open circuit voltage of the electrochemical cell.

6. The method of claim 1, wherein the method is applied to a battery cell, the method further comprising:
determining a set of coefficients α, β, γ specific to chemistry of the battery cell and to a state of health of the battery cell and fitted so that the state of charge of the battery cell is determined as a function of entropy variation ΔS and enthalpy variation ΔH according to: SOC=α+βΔS+γΔH, and
comparing the set of coefficients α, β, γ to reference coefficients corresponding to a battery cell of reference with no internal short circuit.

7. The method of claim 1, further comprising transmitting internal short circuit detection data to a remote processing system.

* * * * *